United States Patent [19]

Templeton et al.

[11] Patent Number: 5,308,740
[45] Date of Patent: May 3, 1994

[54] ELECTRICAL MEASUREMENT OF SIDEWALL ANGLE

[75] Inventors: Michael K. Templeton, Mountain View; Subhash Gupta, San Jose, both of Calif.

[73] Assignee: Advanced Micro Devices, Inc., Sunnyvale, Calif.

[21] Appl. No.: 947,242

[22] Filed: Sep. 18, 1992

[51] Int. Cl.$^5$ .................. G03C 5/00; B44C 1/22
[52] U.S. Cl. ..................... 430/311; 156/643
[58] Field of Search .............. 430/311, 314; 156/643

[56] References Cited

U.S. PATENT DOCUMENTS 4,436,584 3/1984 Bernacki et al. ............ 156/643

OTHER PUBLICATIONS

J. Pelletier et al, "Etching mechanisms of polymers in oxygen microwave multipolar plasmas", in *Applied Physics Letters*, vol. 53(20), pp. 1914–1916 (Nov. 14, 1988).

J. Pelletier et al, "Microwave plasma etching of Si and SiO$_2$ in halogen mixtures: Interpretation of etching mechanisms", in *Journal of Vacuum Science and Technology B*, vol. 7, No. 1, pp. 59–67 (Jan./Feb. 1989).

Primary Examiner—John Kight, III
Assistant Examiner—T. Mosley
Attorney, Agent, or Firm—Benman Collins & Sawyer

[57] ABSTRACT

A method for measuring the sidewall angle of patterned photoresist (16), as well as wall angles of other materials, is provided. The method comprises forming two copies of the patterned photoresist feature for which the sidewall measurement is to be obtained on a conducting substrate (14). The first copy is processed via conventional techniques for linewidth measurement, which consists of a pattern transfer etch of the first copy into the underlying conductive substrate, followed by electrical measurement of the conductor linewidth to yield linewidth 1 (LW1). The second copy is processed such that there is a shape altering etch prior to the pattern transfer etch. A linewidth 2 (LW2) is obtained. The angle is then extracted from the two linewidth measurements.

10 Claims, 6 Drawing Sheets

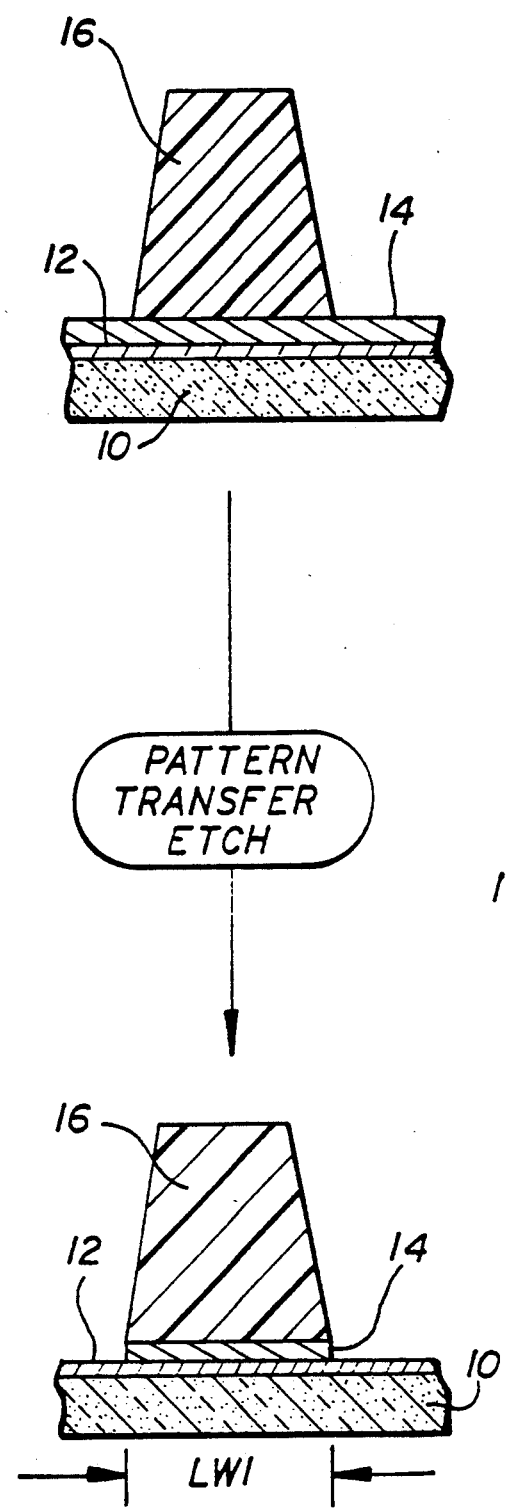
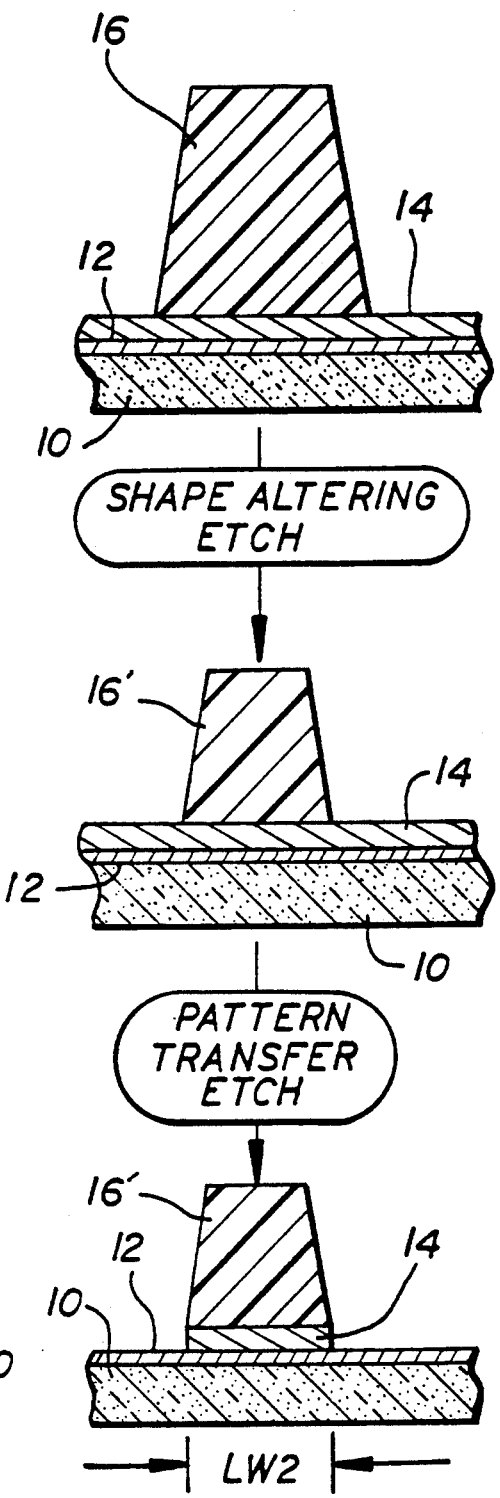

FIG 3a
PROFILE A
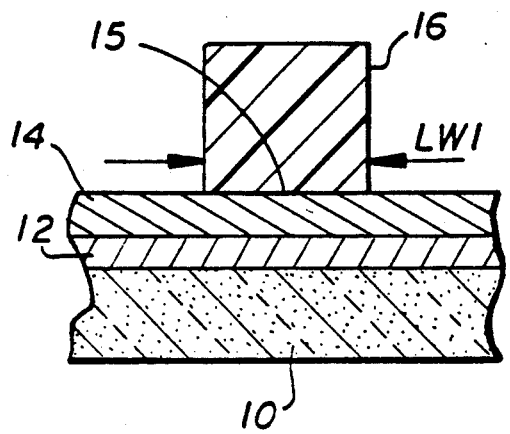
FIG. 4a
PROFILE B
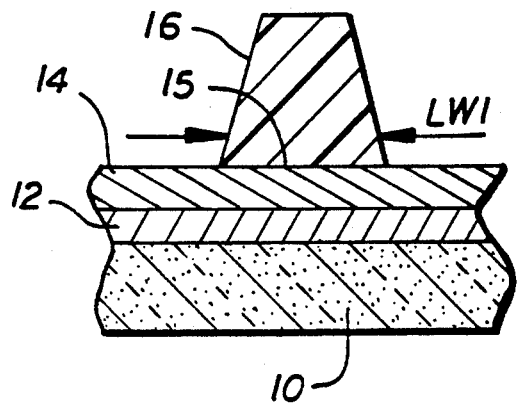
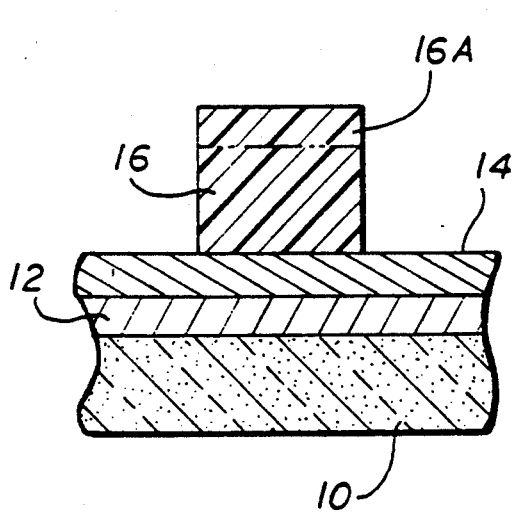
FIG. 3b
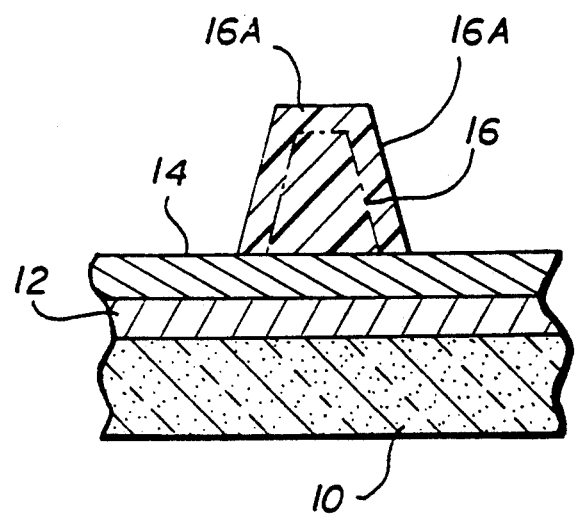
FIG. 4b FIG. 5a
PROFILE A
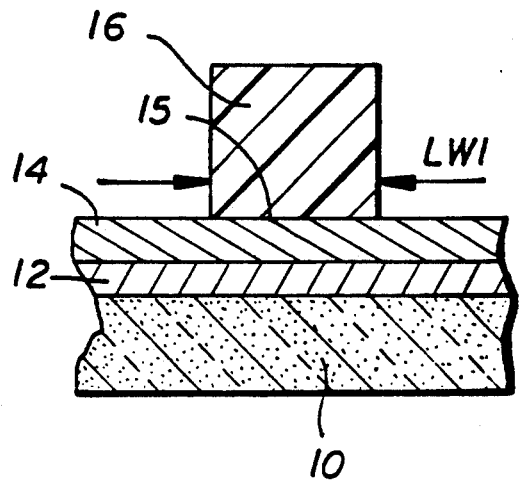
FIG. 6a
PROFILE B
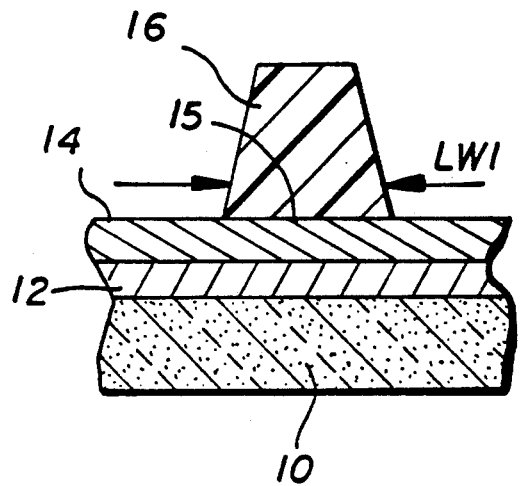
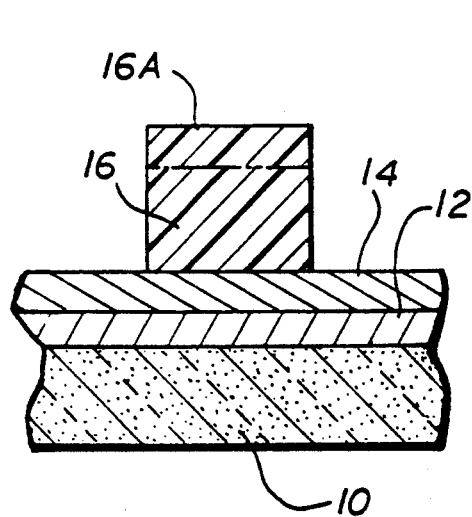
FIG. 5b
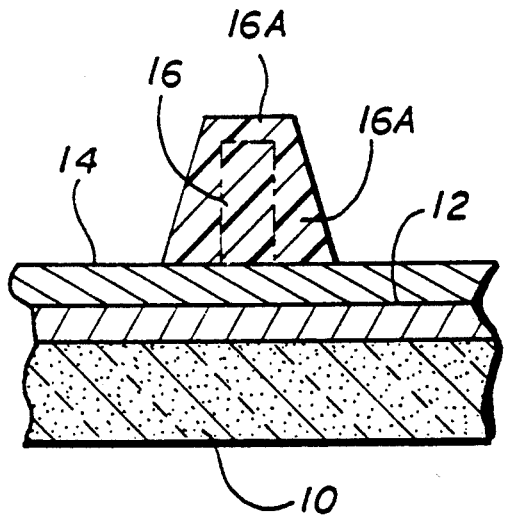
FIG. 6b

ELECTRICAL MEASUREMENT OF SIDEWALL ANGLE

CROSS-REFERENCE TO RELATED APPLICATION

The present application is related to application Ser. No. 07/947,243, filed concurrently herewith, entitled "Surface Image Transfer Etching." In the related application, a surface image transfer etching process is disclosed and claimed. That process is preferably used herein as part of the method of measuring the sidewall angle of, for example, patterned photoresist.

TECHNICAL FIELD

The present invention relates to the measurement of sidewall angles, and, in particular, to electrical measurement of resist sidewall angles.

BACKGROUND ART

Resist sidewall angle impacts photoprocess performance on topography. For example, a sloped sidewall results in a large critical dimension (cd) change in a resist line going over a step in the substrate. Resist sidewall angle also impacts subsequent pattern transfer steps. For example, a sloped resist sidewall can result in a sloped sidewall in the etched material. Sometimes this is desirable, but often it is not. Currently, the most common method for measuring sidewall angles of patterned materials is with a scanning electron microscope (SEM). This, however, is labor intensive and time consuming.

A need remains for a method of measuring resist sidewall angle.

DISCLOSURE OF INVENTION

In accordance with the invention, sidewall angle measurements are performed using conventional electrical linewidth measurement techniques. In specific application to measuring resist sidewall angles, the method requires two copies of a patterned photoresist feature for which the sidewall measurement is to be obtained on a conducting substrate.

The first copy is processed by conventional techniques for linewidth measurement. This consists only of a pattern transfer etch, such as by reactive ion etching (RIE), wet etching, etc., of the first copy into the underlying conductive substrate, followed by electrical measurement of the conductor linewidth. This gives linewidth 1 (LW1).

The second copy is processed as above, but includes an additional step. Prior to the pattern transfer etch, the second copy is etched by a process that alters the shape of the second copy. Furthermore, the shape alteration which the second copy undergoes is dependent on etch process and/or the original shape of the second copy. It is important to note that this shape-altering etch is not a pattern transfer etch, and consequently should have little effect on the underlying conductive substrate (etches with this character are known to exist, since organic-based photoresists generally have a very different etch chemistry than conductors such as metal or polysilicon). Once the shape-altering etch has been performed, the second copy is processed with the pattern transfer etch, as with the first copy, and yields linewidth 2 (LW2) after electrical measurements.

Where a surface image transfer etch process is used as the shape-altering etch, the resist sidewall angle $\theta_r$ is then calculated according to the formula $$\theta_r = \mathrm{Arctan}(T_r/\Delta)$$

where $T_r$ is the initial resist thickness prior to etching the second copy and $\Delta = (LW1 - LW2)/2$.

Other objects, features, and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

FIG. 1 is a schematic flow diagram, partly in section, showing the pattern transfer etch for processing the first copy;

FIG. 2 is a schematic flow diagram, partly in section, showing the combination of shape-altering etch and pattern transfer etch for processing the second copy;

BEST MODES FOR CARRYING OUT THE INVENTION

Figure 3C:
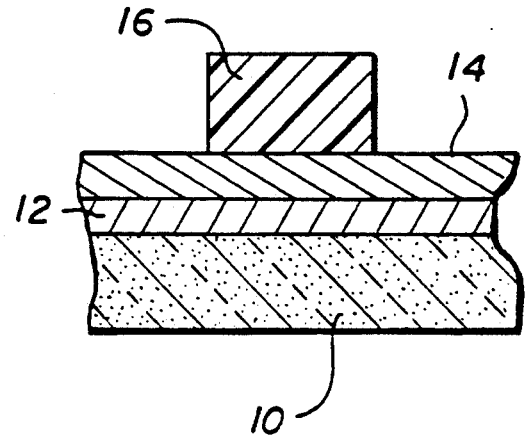
FIG. 3 depicts the results of blanket etching on one resist profile (in cross-section)

Reference is now made in detail to a specific embodiment of the present invention, which illustrates the best mode presently contemplated by the inventors for practicing the invention. Alternative embodiments are also briefly described as applicable.

In accordance with the invention, sidewall angle measurements use conventional electrical linewidth measurement techniques. In specific application to measuring resist sidewall angles, the method requires two copies of a patterned photoresist feature for which the sidewall measurement is to be obtained on a conducting substrate.

Reference is now made to FIGS. 1 and 2. Copy "1" (see FIG. 1) is processed by conventional techniques for linewidth measurement. A substrate 10 is shown, supporting an insulating layer 12, on which a conductive layer 14 is formed. A patternable layer 16, such as photoresist, is formed on top of the conductive layer 14.

This consists only of a pattern transfer etch, such as by reactive ion etching (RIE), wet etching, etc., of patterned portion 16 (Copy 1) into the underlying conductive substrate 14, followed by electrical measurement of the conductor linewidth. This gives linewidth 1 (LW1).

Copy "2" is processed as above, but includes an additional step. Prior to the pattern transfer etch, the patterned portion 16 (Copy 2) is etched by a process that alters the shape of Copy 2, shown as 16'. Furthermore, the shape alteration which Copy 2 undergoes is dependent on etch process and/or the original shape of Copy 2. It is important to note that this shape-altering etch is not a pattern transfer etch, and consequently should have little effect on the underlying conductive substrate 14 (etches with this character are known to exist, since organic-based photoresists generally have a very different etch chemistry than conductors such as metal or polysilicon). Once the shape-altering etch has been performed, Copy 2 is processed with the pattern transfer etch, as with Copy 1, and yields linewidth 2 (LW2) after electrical measurements.

The extraction of the resist sidewall angle from the two linewidth measurements (LW1 and LW2) depends upon the nature of the shape altering etch. Illustration follows for two of the most useful kinds of shape altering etches, blanket etch and surface image transfer etch.

Figure 4C:
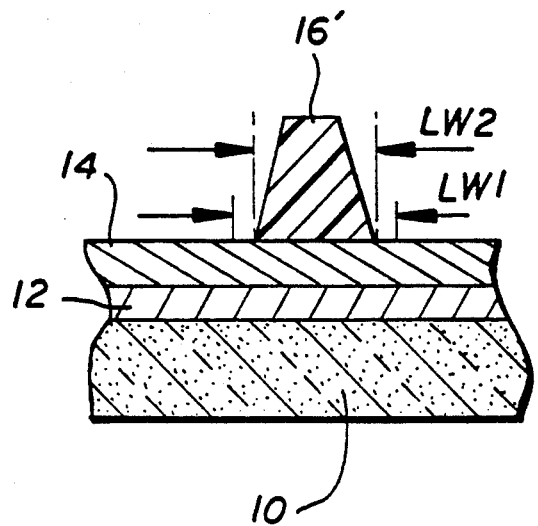
FIG. 4 is similar to FIG. 3, except that a second resist profile is depicted.
Figure 3D:
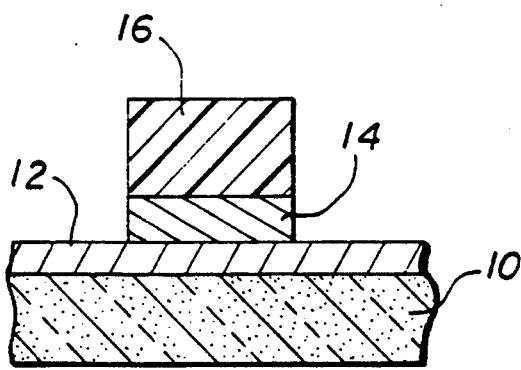
Figure 4D:
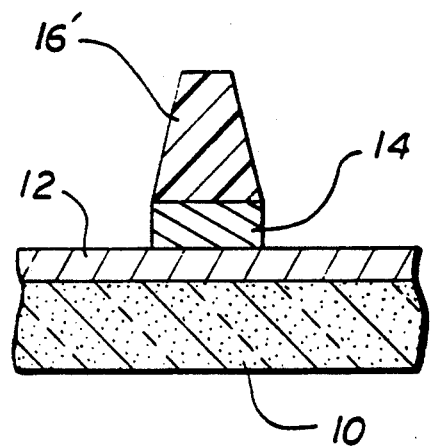

In the blanket etch process, the effect of this process on two resist profiles with different wall angles is depicted in FIGS. 3 and 4. Resist profile A has a 90° wall angle (FIG. 3), while resist profile B has an intermediate wall angle (FIG. 4). However, both profiles have the same critical dimension, or linewidth, at the resist/substrate interface 15. Profile A and B before the blanket etch are shown in FIGS. 3a and 4a, respectively. The blanket etch used is a highly directional etch that essentially removes a layer of resist 16 that is exposed to the plasma. The amount and location of the resist removed by the blanket etch is shown in the phantom portion 16a of the resist profiles in FIGS. 3b and 4b. FIGS. 3c and 4c show the resist profiles after the blanket etch. FIGS. 3d and 4d show that the linewidth of the conductor 14 will be dependent on resist wall angle if the profiles are first processed with the blanket etch before receiving the pattern transfer etch into the conductor. If the two electrical linewidth measurements (LW1 and LW2) for the two Copies are compared (without the shape altering etch (LW1) and with the shape altering etch (LW2)), it is seen that LW1 equals LW2 for the 90° resist profile (compare FIG. 3a with FIG. 3d), while LW1 is greater than LW2 for the resist profile with intermediate wall angle (compare FIG. 4a with FIG. 4d). Furthermore, for the resist with intermediate wall angle, the decrease in linewidth in going from LW1 to LW2 will depend upon the amount of resist removed during the blanket etch, which depends only on the resist wall angle (for fixed etching conditions).

In the surface image transfer etch (SITE) process, the effect of this process on two resist profiles with different wall angles is depicted in FIGS. 5 and 6. Resist profile A has a 90° wall angle (FIG. 5), while resist profile B has an intermediate wall angle (FIG. 6). However, both profiles have the same critical dimension (cd), or feature width, at the resist/substrate interface 15. Profile A and B before the SITE process are shown in FIGS. 5a and 6a, respectively.

Figure 5C:
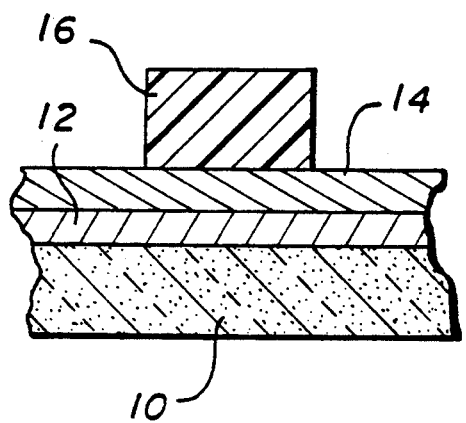
FIG. 5 depicts the results of surface image transfer etch on one resist profile (in cross-section)
Figure 6C:
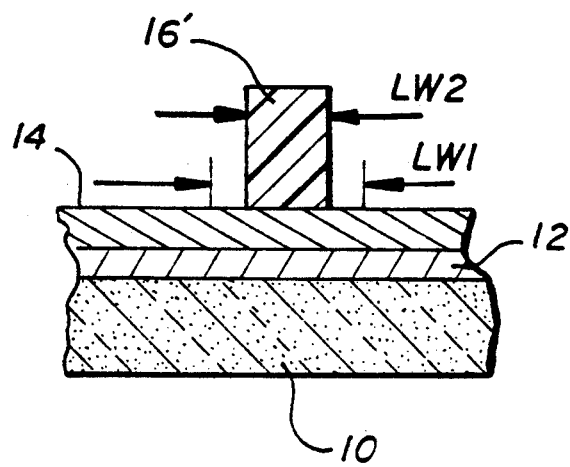
FIG. 6 is similar to FIG. 5, except that a second resist profile is depicted.
Figure 5D:
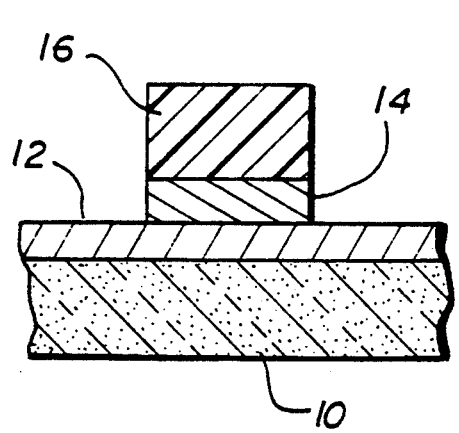
Figure 6D:
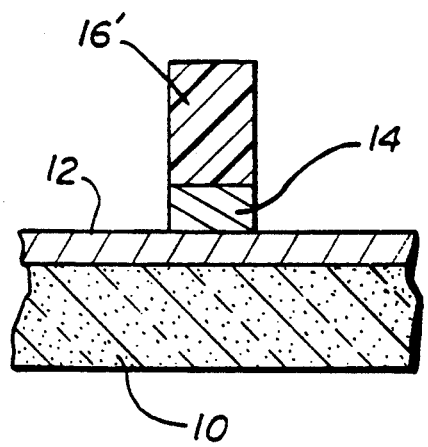

The SITE process is a highly directional, or anisotropic, etch where the etching rate is greatly increased for any surface that is not at normal incidence to the trajectory of the plasma ions bombarding the etched surface (experimental data showing that such an etch process exists is given below). The amount and location of the resist removed by the blanket etch is shown in the shaded portion 16a of the resist profiles in FIGS. 5b and 6b. FIGS. 5c and 6c show the resist profiles after the SITE process. FIGS. 5d and 6d show that the linewidth of the conductor 14 will be dependent on resist wall angle if the profiles are first processed with the SITE process before receiving the pattern transfer etch into the conductor. If the two electrical linewidth measurements (LW1 and LW2) for the two Copies are compared (without the shape altering etch (LW1) and with the shape-altering etch (LW2)), it is seen that LW1 equals LW2 for the 90° resist profile (compare FIG. 5a with FIG. 5d), while LW1 is greater than LW2 for the resist profile with intermediate wall angle (compare FIG. 6a with FIG. 6d). Furthermore, LW2 is very nearly equal to the dimension of the top of the resist feature. This greatly simplifies the determination of the sidewall angle. By analytic geometry, it can be shown that $$\theta_r = \text{Arctan}(T_r/\Delta) \quad (1)$$

where $\theta_r$ is the resist sidewall angle, $T_r$ is the initial resist thickness before the SITE process, and $\Delta = (LW1 - LW2)/2$. Using SITE as the shape-altering etch before the pattern transfer etch allows the resist sidewall angles to be obtained from only two electrical linewidth measurements. Moreover, unlike using a blanket shape-altering etch (as discussed above), when using SITE, LW2 is not dependent upon the shape-altering etch time. This leads to a robust methodology for determining sidewall angle.

Figure 7:
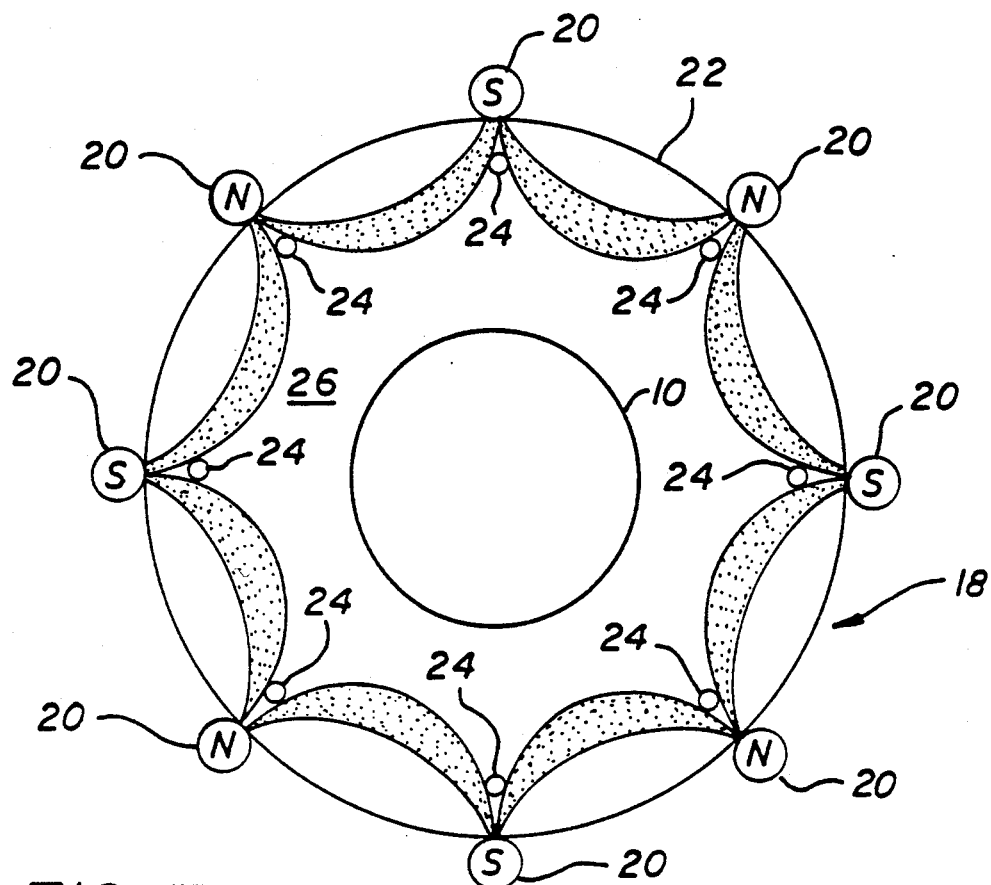
FIG. 7 is a schematic diagram of a distributed cyclotron resonance (DECR) reactor which is used as an etch chamber in the practice of the invention.

A schematic of a distributed electron cyclotron resonance (DECR) reactor 18 which is used as an etch chamber for the SITE process is depicted in FIG. 7. Eight permanent magnets 20 (about 1 Kgauss and having approximate dimensions of 10 mm width, 10 mm thickness, and 150 mm length) are attached symmetrically with alternate magnetic poles as shown in FIG. 7 on the outside of the cylindrical chamber wall 22 of the reactor 18.

A set of antennae 24 is placed inside of the chamber 26, very close to the wall 22. Microwave (2.45 GHz) power is transmitted through the antennae 24. The antennae comprise 10 mm diameter rods, arranged parallel to the chamber wall 22. This configuration permits the electrons to absorb the energy and hence give rise to high density plasma.

The bottom of the antennae 24 and magnets 10 are at the same plane as the surface of the wafer 14. The antennae and magnets are placed perpendicular to the surface of the wafer.

Figure 8:
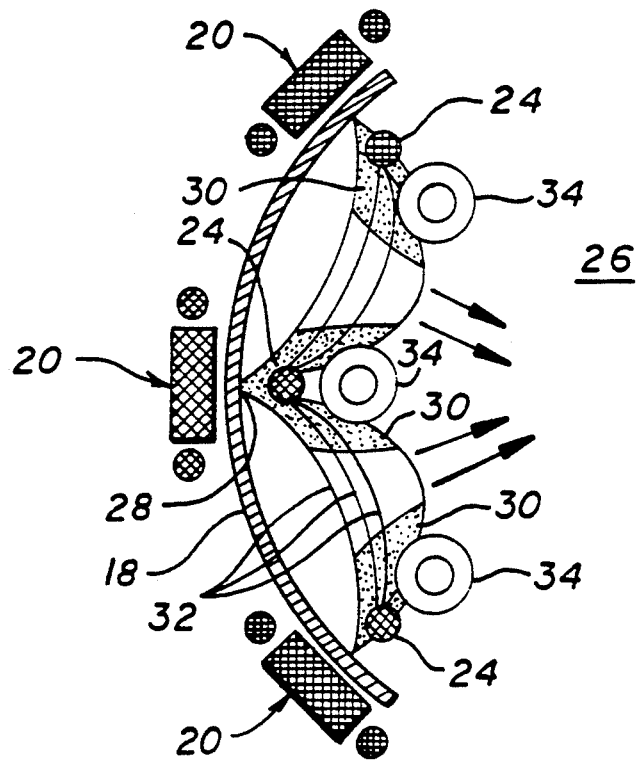
FIG. 8 is a sectional portion of FIG. 7, depicting the magnetic fields and electron cyclotron resonances employed in the practice of the invention.

The conditions for energy absorption via electron cyclotron resonance are satisfied at the magnetic cusps 28 where the magnetic field strength is 875 gauss. This is illustrated in FIG. 8 as the shaded areas 30 where electron cyclotron resonance occurs. It is believed that the ions produced in the DECR plasma will have substantial kinetic energy and consequently a much higher velocity (due to the fact that charged species will be repelled by the magnetic field), as compared to the initial ion energy and ion velocity in conventional RF (radio frequency) cold plasmas. In most of the parallel plate reactive ion etch (RIE) systems, the velocity of the ions within the plasma is presumed nearly zero (which is a reasonable assumption) and the ions gain energy only in the dark space (also known as the plasma sheath very close to the wafer) due to the electropotential difference between the plasma potential $V_p$, which is positive, and the self, or external, bias potential $V_b$, which is negative.

However, from FIG. 8, one would expect that as soon as the gases dissociate to form ions, the magnetic lines of force (shown at 32) would repel the charged particles and consequently impart an energy/velocity to the ions. Since the wafer 10 is placed in the center of the chamber 26 in DECR systems, away from the ECR plasma source 34, it is reasonable to believe that the ions arriving at the wafer will have a parabolic trajectory which could be modified by applying an additional external bias potential. An external RF source (not shown) is used for supplying the needed bias on wafers, and controlling the ion energies incident to the wafer surface.

In this invention, the inventors have demonstrated that by selecting appropriate process parameters, the trajectory of the ions can be controlled such that the reaction/sputter yield is nearly zero when the locus of the ion is parallel to the resist pattern with wall angle of 90°, and the reaction/sputter yield is maximum when the surface is perpendicular to the incident ion.

Although the foregoing discussion has focused on measuring photoresist sidewall angles, wall angles of other materials may also be measured by applying these same concepts, employing pattern transferring processes.

EXAMPLES

EXAMPLE 1

Electrical Wall Angles Using SITE as the Shape Altering Etch

A thin (approximately 200 Å) barrier oxide was grown on two 100 mm silicon wafers (wafer 1 and wafer 2) in an oxidation furnace. About 1,800 Å of polysilicon was deposited onto the wafers using low pressure chemical vapor deposition (LPCVD). The polysilicon was doped with $POCl_3$, and the phosphorus was activated with a furnace cycle. The substrates were then vapor primed with HMDS (hexamethyldisilizane), and then coated with 1.01 μm of Shipley System 9D1L photoresist. The coated wafers were exposed on an ASM 5000/50 i-line stepper. The test reticle pattern was designed for producing electrical linewidth structures in the polysilicon after etching the resist mask. These are generally known as "Prometrix electrical test structures" to those knowledgeable in the art. The test reticle was stepped in a focus X exposure pattern on the photoresist-coated wafer, and developed by conventional means. The wafers were DUV-stabilized with a Fusion model PC150.

Wafer 2 was etched in a distributed electron cyclotron resonance (DECR) etcher made by Alcatel with the following process chemistry:

Flow rates:
  $Cl_2$: 5.0 sccm
  $N_2$: 10.0 sccm
  $O_2$: 2.1 sccm
Bias voltage: 39 volts or 70 volts
Power: 1000 watts
Pressure: 0.859 mTorr
Etch time: ≈150 sec.

It will be appreciated that HBr can be used in place of $Cl_2$ and that oxygen may be omitted if desired.

Using this process chemistry in the Alcatel etcher results in a shape-altering etch process having the characteristics of the surface image transfer etch described earlier.

Both wafers were then etched to transfer the resist pattern into the underlying polysilicon using a Tegal 1511e reactive ion etcher.

The resist was then stripped, and the wafers electrically probed at a Prometrix EM1 electrical linewidth measurement testing station. The electrical cd data 0.6 μm dense lines for wafers 1 and 2 are shown in Table I for each of the die in the focus x exposure matrix.

TABLE I

| Electrically Measured Critical Dimension for Wafers 1 and 2. | | | | | | | | | | |
|---|---|---|---|---|---|---|---|---|---|---|
| 1.000 | 2.000 | 3.000 | 4.000 | 5.000 | 6.000 | 7.000 | 8.000 | 9.000 | 10.000 | 11.000 |
| Wafer 1-Bottom CD | | | | | | | | | | |
| 1.200 | 1.200 | 1.200 | 1.200 | 1.200 | 1.200 | 1.200 | 1.200 | 1.200 | 1.200 | 1.200 |
| 1.200 | 1.200 | 1.200 | 1.200 | 1.200 | 1.200 | 1.200 | 1.200 | 1.200 | 1.200 | 1.200 |
| 1.200 | 1.200 | 1.200 | 1.200 | 0.709 | 0.690 | 1.200 | 1.200 | 1.200 | 1.200 | 1.200 |
| 1.200 | 1.200 | 1.200 | 0.604 | 0.588 | 0.596 | 0.608 | 0.643 | 0.728 | 1.200 | 1.200 |
| 1.200 | 0.537 | 0.547 | 0.519 | 0.502 | 0.501 | 0.501 | 0.510 | 0.529 | 1.200 | 0.000 |
| 0.000 | 0.472 | 0.483 | 0.477 | 0.468 | 0.465 | 0.470 | 0.422 | 0.392 | 0.000 | 0.000 |
| 0.426 | 0.434 | 0.446 | 0.450 | 0.436 | 0.429 | 0.389 | 0.362 | 0.000 | 0.000 | 0.000 |
| 0.380 | 0.369 | 0.407 | 0.416 | 0.428 | 0.385 | 0.331 | 0.000 | 0.000 | 0.000 | 0.000 |
| 0.000 | 0.297 | 0.360 | 0.384 | 0.386 | 0.388 | 0.293 | 0.000 | 0.000 | 0.000 | 0.000 |
| 0.000 | 0.294 | 0.346 | 0.366 | 0.365 | 0.363 | 0.332 | 0.283 | 0.258 | 0.000 | 0.000 |
| 0.000 | 0.323 | 0.352 | 0.364 | 0.359 | 0.341 | 0.259 | 0.000 | 0.000 | 0.000 | 0.000 |
| Wafer 2-Top CD | | | | | | | | | | |
| 1.200 | 1.200 | 1.200 | 1.200 | 1.200 | 1.200 | 1.200 | 0.709 | 1.200 | 1.200 | 1.200 |
| 1.200 | 1.200 | 1.200 | 1.200 | 0.667 | 0.663 | 0.663 | 1.200 | 0.667 | 0.674 | 0.682 |
| 1.200 | 1.200 | 0.611 | 0.612 | 0.632 | 0.627 | 0.623 | 0.565 | 0.547 | 0.555 | 0.514 |
| 0.000 | 0.500 | 0.560 | 0.562 | 0.570 | 0.557 | 0.554 | 0.553 | 0.489 | 0.405 | 0.000 |
| 0.000 | 0.429 | 0.502 | 0.519 | 0.524 | 0.522 | 0.506 | 0.478 | 0.406 | 0.000 | 0.000 |
| 0.000 | 0.000 | 0.457 | 0.478 | 0.493 | 0.486 | 0.414 | 0.417 | 0.395 | 0.000 | 0.926 |
| 0.000 | 0.000 | 0.348 | 0.454 | 0.467 | 0.453 | 0.383 | 0.315 | 0.000 | 0.000 | 0.000 |
| 0.000 | 0.000 | 0.000 | 0.425 | 0.441 | 0.415 | 0.398 | 0.000 | 0.000 | 0.000 | 0.000 |
| 0.000 | 0.000 | 0.000 | 0.000 | 0.397 | 0.396 | 0.355 | 0.000 | 0.000 | 0.000 | 0.000 |
| 0.000 | 0.000 | 0.000 | 0.000 | 0.385 | 0.362 | 0.312 | 0.351 | 0.289 | 0.000 | 0.000 |
| 0.000 | 0.000 | 0.000 | 0.000 | 0.000 | 0.355 | 0.000 | 0.000 | 0.000 | 0.000 | 0.000 |

Using eqn. (1), the linewidth measurement of wafer 1 (LW1) can be combined with the corresponding linewidth of wafer 2 (LW2), to yield wall angle data for every die of the focus exposure matrix. These data are shown in Table II.

TABLE II

Computed Wall Angle.

| | | | | | | | | | | |
|---|---|---|---|---|---|---|---|---|---|---|
| 00.0 | 00.0 | 00.0 | 00.0 | 00.0 | 00.0 | 00.0 | 76.4 | 00.0 | 00.0 | 00.0 |
| 00.0 | 00.0 | 00.0 | 00.0 | 75.2 | 75.1 | 75.1 | 0.00 | 75.2 | 75.4 | 75.6 |
| 00.0 | 00.0 | 73.7 | 73.8 | 87.8 | 88.2 | 74.0 | 72.6 | 72.1 | 72.3 | 71.3 |
| 59.3 | 70.9 | 72.4 | 88.8 | 89.5 | 88.9 | 88.5 | 87.4 | 83.3 | 68.5 | 59.3 |
| 59.3 | 86.9 | 88.7 | 90.0 | 90.6 | 90.6 | 90.1 | 89.1 | 86.5 | 59.3 | 00.0 |
| 00.0 | 76.8 | 89.2 | 90.0 | 90.7 | 90.6 | 88.4 | 89.9 | 90.1 | 00.0 | 00.0 |
| 78.1 | 77.9 | 87.2 | 90.1 | 90.9 | 90.7 | 89.8 | 88.7 | 00.0 | 00.0 | 00.0 |
| 79.4 | 79.6 | 78.6 | 90.2 | 90.4 | 90.9 | 91.9 | 00.0 | 00.0 | 00.0 | 00.0 |
| 0.00 | 81.6 | 79.9 | 79.2 | 90.3 | 90.2 | 91.8 | 00.0 | 00.0 | 00.0 | 00.0 |
| 0.00 | 81.7 | 80.3 | 79.7 | 90.6 | 90.0 | 89.4 | 91.9 | 90.0 | 00.0 | 00.0 |
| 0.00 | 80.9 | 80.1 | 79.8 | 79.9 | 90.4 | 82.7 | 00.0 | 00.0 | 00.0 | 00.0 |

Industrial Applicability

The determination of sidewall angle by the method disclosed herein is expected to find use in semiconductor processing.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A method for determining the sidewall angle of a structure supported on a surface of a substrate, comprising:
   (a) forming an etchable conducting layer over said surface of said substrate;
   (b) forming said structure on said etchable conducting layer;
   (c) measuring a first linewidth on a first portion of said etchable conducting layer by a process comprising
      (1) forming a patterned layer of lines having a given width in said structure on said conducting layer, leaving exposed portions thereof,
      (2) performing a pattern transfer etch by removing said exposed portions to leave patterned areas in said conducting layer which replicate said patterned layer and which have a first linewidth equal to said given width, and
      (3) electrically measuring said first linewidth;
   (d) measuring a second linewidth on a second portion of said etchable conducting layer by a process comprising
      (1) forming a patterned layer of lines having a given width on said conducting layer, leaving exposed portions thereof,
      (2) performing a shape-altering etch that alters the shape of said patterned layer,
      (3) performing a pattern transfer etch by removing said exposed portions to leave patterned areas in said conducting layer which replicate said patterned layer and which have a second linewidth equal to said given width, and
      (4) electrically measuring said second linewidth; and
   (e) calculating said sidewall angle by comparing said second linewidth to said first linewidth.

2. The method of claim 1 wherein said shape-altering process comprises a blanket etch.

3. The method of claim 1 wherein said shape-altering process comprises a surface image transfer etch, employing a plasma ion etch, in which the etching rate of said structure is greatly increased for any surface that is not at normal incidence to the trajectory of plasma ions bombarding the etched surface.

4. The method of claim 3 wherein said sidewall angle is calculated by the equation $$\theta_r = \text{Arctan}(T_r/\Delta)$$

where $\theta_r$ is the resist sidewall angle, $T_r$ is the initial resist thickness before the surface image transfer etch process, and $\Delta = (LW1 - LW2)/2$, where LW1 is said first linewidth and LW2 is said second linewidth.

5. The method of claim 1 wherein said etch steps are performed in a distributed electron cyclotron resonance reactor in a chamber provided with magnets on the outside of said chamber with alternating magnetic poles from one magnet to the next and with antennae on the inside of said chamber and operatively associated with said magnets, with the bottom of said magnets and said antennae at the same plane as said substrate and with said magnets and said antennae perpendicular to said surface of said substrate.

6. The method of claim 1 wherein said substrate comprises a semiconductor material and said structure comprises a patternable material.

7. The method of claim 6 wherein said patternable material comprises photoresist.

8. A method for determining the sidewall angle of a structure comprising a patternable material on a surface of a semiconductor substrate, comprising:
   (a) forming an etchable conducting layer over said surface of said substrate;
   (b) forming said structure on said etchable conducting layer;
   (c) measuring a first linewidth on a first portion of said etchable conducting layer by a process comprising
      (1) forming a patterned layer of lines having a given width on said conducting layer, leaving exposed portions thereof,
      (2) performing a pattern transfer etch by removing said exposed portions to leave patterned areas in said conducting layer which replicate said patterned layer and which have a first linewidth equal to said given width, and (3) electrically measuring said first linewidth;

(b) measuring a second linewidth on a second portion of said etchable conducting layer by a process comprising (1) forming a patterned layer of lines having a given width on said conducting layer, leaving exposed portions thereof, (2) performing a shape-altering etch that alters the shape of said patterned layer, said shape-altering process comprising a surface image transfer etch, employing a plasma ion etch, in which the etching rate of said structure is greatly increased for any surface that is not at normal incidence to the trajectory of plasma ions bombarding the etched surface, (3) performing a pattern transfer etch by removing said exposed portions to leave patterned areas in said conducting layer which replicate said patterned layer and which have a second linewidth equal to said given width, and (4) electrically measuring said second linewidth; and (c) calculating said sidewall angle by the equation $$\theta_r = \text{Arctan}(T_r/\Delta)$$

where $\theta_r$ is the resist sidewall angle, $T_r$ is the initial resist thickness before the surface image transfer etch process, and $\Delta = (LW1 - LW2)/2$, where LW1 is said first linewidth and LW2 is said second linewidth.

9. The method of claim 8 wherein said etch steps are performed in a distributed electron cyclotron resonance reactor in a chamber provided with magnets on the outside of said chamber with alternating magnetic poles from one magnet to the next and with antennae on the inside of said chamber and operatively associated with said magnets, with the bottom of said magnets and said antennae at the same plane as said substrate and with said magnets and said antennae perpendicular to said surface of said substrate.

10. The method of claim 8 wherein said patternable material comprises photoresist.

* * * * *